United States Patent [19]

Minagawa et al.

[11] Patent Number: 5,010,520
[45] Date of Patent: Apr. 23, 1991

[54] NONVOLATILE SEMICONDUCTOR MEMORY DEVICE WITH STABILIZED DATA WRITE CHARACTERISTIC

[75] Inventors: Hidenobu Minagawa, Kawasaki; Yuuichi Tatsumi, Tokyo; Hiroshi Iwahashi, Yokohama; Masamichi Asano, Tokyo; Hiroto Nakai, Kawasaki; Mizuho Imai, Annaka, all of Japan

[73] Assignee: Kabushiki Kaisha Toshiba, Kawasaki, Japan

[21] Appl. No.: 224,953

[22] Filed: Jul. 27, 1988

[30] Foreign Application Priority Data

Jul. 29, 1987 [JP] Japan ................... 62-189433
Nov. 12, 1987 [JP] Japan ................... 62-285748

[51] Int. Cl.⁵ .............. G11C 11/34; G11C 11/40; G11C 11/412; G11C 17/12
[52] U.S. Cl. ...................... 365/174; 365/182; 365/185; 365/148
[58] Field of Search ......... 365/174, 182, 185, 189.11, 365/189.01, 148; 357/23.6; 307/36, 38

[56] References Cited

U.S. PATENT DOCUMENTS

| 4,037,218 | 7/1977 | Gröeger et al. | 365/148 X |
| 4,371,956 | 2/1983 | Maeda et al. | 365/185 |
| 4,477,884 | 10/1984 | Iwahashi et al. | 365/185 X |
| 4,589,097 | 5/1986 | Ebihara | 365/185 X |
| 4,597,062 | 6/1986 | Asano et al. | 365/185 X |
| 4,616,339 | 10/1986 | Cuppens et al. | 365/185 |
| 4,694,429 | 9/1987 | Tanaka et al. | 365/185 X |
| 4,730,279 | 3/1988 | Ohtani | 365/190 X |
| 4,761,764 | 8/1988 | Watanabe | 365/185 X |
| 4,791,613 | 12/1988 | Hardee | 365/190 X |
| 4,858,187 | 8/1989 | Schreck | 365/185 |
| 4,887,242 | 12/1989 | Hashimoto | 365/189.11 X |

FOREIGN PATENT DOCUMENTS 0157389 3/1985 European Pat. Off.
2103880A 2/1983 United Kingdom.

OTHER PUBLICATIONS

IEEE Journal of SSC, vol. SC-20, No. 5, Oct. 1985, "A 256K CMOS SRAM with Variable Impedance Data-Line Loads" by Yamamoto et al.
Japanese Patent Disclosure (Kokai) No. 62-114273 to N. Ando et al., May 26, 1987.
Japanese Patent Disclosure (Kokai) No. 62-146497 to N. Orita, Jun. 30, 1987.
Patent Abstracts of Japan, vol. 7, No. 134 (P-203) [1279], Jun. 11, 1983, and JP-A-58 50 700 (Hitachi Seisakusho K.K.), Mar. 25, 1983.
Patent Abstracts of Japan, vol. 11, No. 236 (P-601) [2683], and JP-A-62 47 899 (Hitachi Ltd.), Mar. 2, 1987.
Patent Abstracts of Japan, vol. 5, No. 9 (P-45) [681], Jan. 21, 1981, and JP-A-55 139 690 (Nippon Denshin Denwa Kosha), Oct. 31, 1980.

Primary Examiner—Alyssa H. Bowler
Attorney, Agent, or Firm—Finnegan, Henderson, Farabow, Garrett and Dunner

[57] ABSTRACT

In a nonvolatile semiconductor memory device, a wiring layer is connected between a power source and a memory cell. Resistance of the wiring layer is larger than the on-resistance of a load transistor, so that the load transistor substantially determines the load characteristic. Therefore, the load characteristic curve is more gentle in inclination and more rectilinear in shape. This makes the data writing operation stable against a variance in the channel lengths of manufactured transistors forming the memory cells.

21 Claims, 15 Drawing Sheets

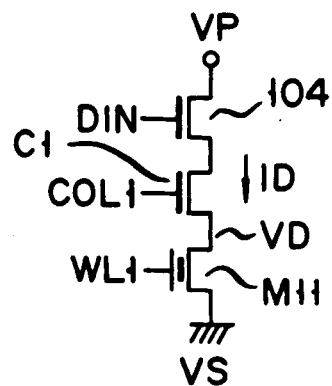
F I G. 2A
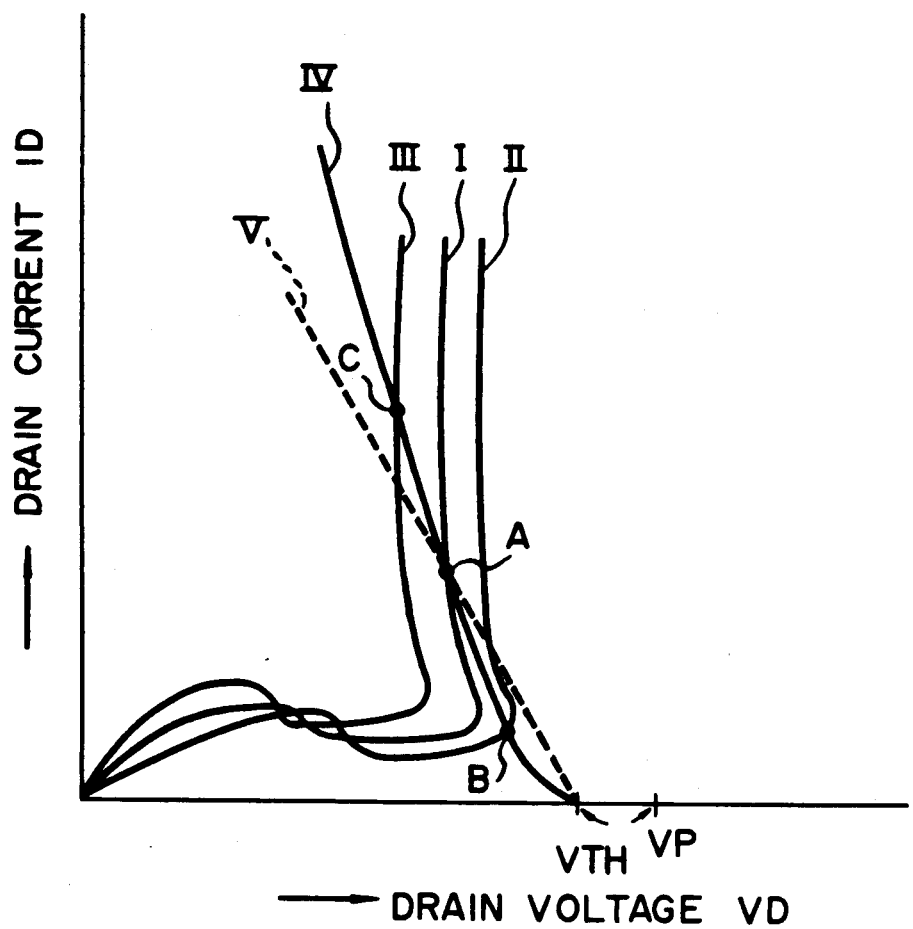
F I G. 2B

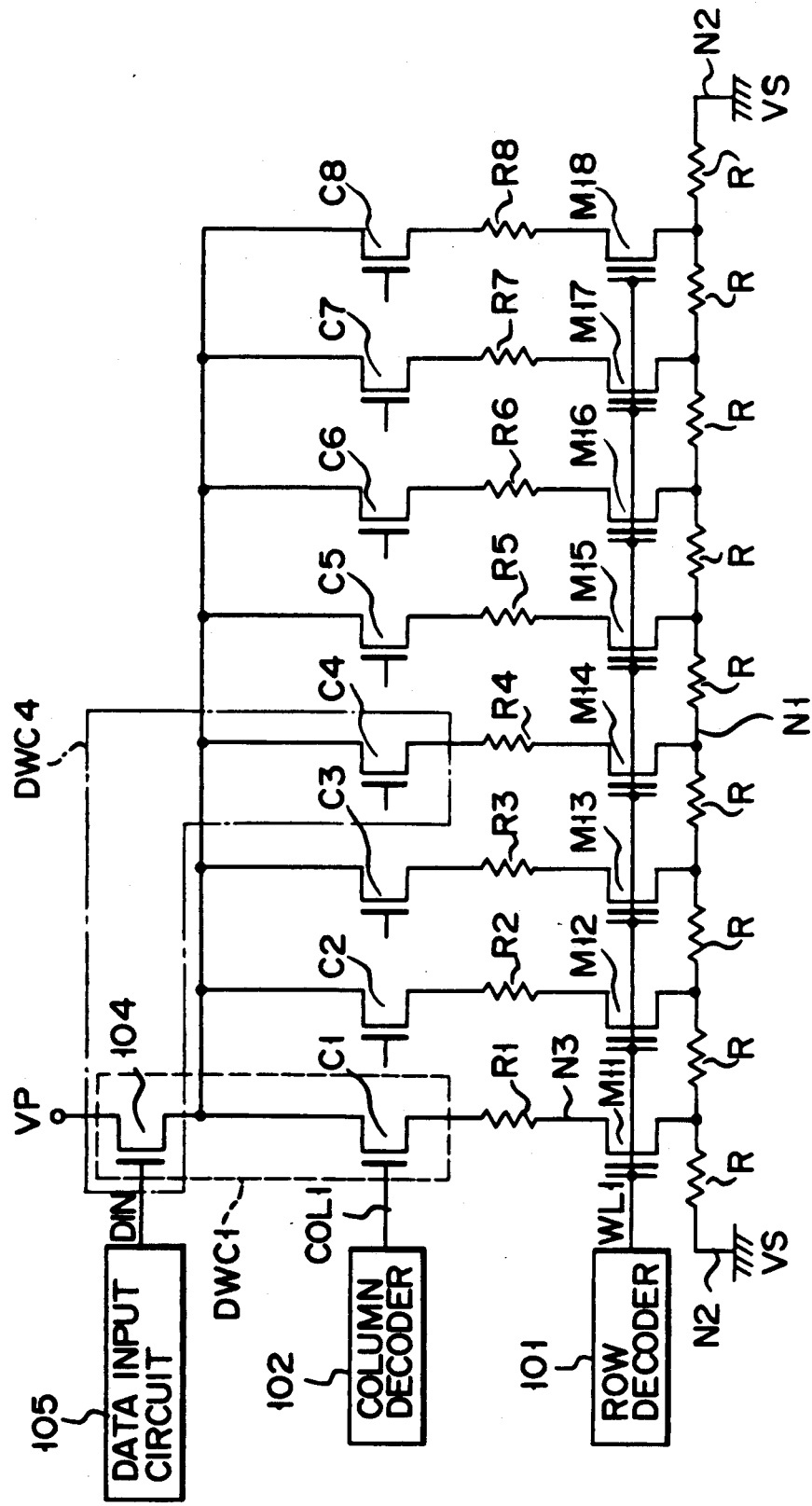
F I G. 12

NONVOLATILE SEMICONDUCTOR MEMORY DEVICE WITH STABILIZED DATA WRITE CHARACTERISTIC

BACKGROUND OF THE INVENTION

1. Field of the Invention

This invention relates to a nonvolatile semiconductor memory device having a data write load circuit and with an improved data write characteristic.

2. Description of the Related Art

A nonvolatile semiconductor memory device, particularly an EPROM whose memory cells are double gate nonvolatile MOS transistors with a floating gate and a control gate, allows data to be rewritten thereinto. Because of this feature, the EPROMs have been used in various types of computer systems. In a negative state of the memory cell, or the cell transistor, in which electrons have been injected into the floating gate, the threshold voltage of the memory cell is high. Therefore, in this state, even if a high level voltage of 5 V, for example, is applied to the control gate of the cell transistor, the transistor will not be conductive. In a neutral state where no electrons are injected into the floating gate, the threshold voltage maintains its initial low voltage. In this state, if the high level voltage is applied to the control gate, the cell transistor is conductive. If logical "1" and "0" are respectively assigned to the conductive and nonconductive states of the cell transistor, the data can be detected.

To inject electrons into the floating gate, a write or program voltage much higher than the normal power source voltage (5 V) is applied to the floating gate and the drain. The program voltage is 12.5 to 21 V, for example. Under such a high program voltage, impact ionization occurs in the channel region near the drain, to generate hot electrons. In turn, the hot electrons are injected into the floating gate. The electrons once injected into the floating gate are left in the floating gate unless a data erase operation is applied to the cell transistor. In this way, the cell transistor can store the data in a nonvolatile manner.

FIG. 1 shows a schematic diagram of an EPROM using the nonvolatile semiconductor memory cell as mentioned above. In the figure, WL1 to WLm designate row lines to which the decoded row signals are supplied from row decoder 101. COL1 to COLn indicate column select lines to which the decoded column signals are supplied from column decoder 102. Column select lines COL1 to COLn are coupled with the gates of column select MOS transistors C1 to Cn of enhancement type (E type). These transistors are driven by the decoded column signals coming through "n" column select lines COL1 to COLn. The first ends of these column select transistors C1 to Cn are connected together to node 103, while the second ends are connected to "n" column lines BL1 to BLn. These column lines BL1 to BLn are laid out crossing row lines WL1 to WLm. Double gate memory cells M11 to Mmn are placed at the intersections of the column and row lines. The gates of these cell transistors M11 to Mmn are connected to row lines WL1 to WLm, respectively. The drains are respectively connected to column lines BL1 to BLn. The sources are connected together with ground voltage VS of 0 V, for example. Node 103 is connected to the source of MOS transistor 104. The drain of this transistor 104 is coupled with external program voltage VP. The gate is connected to the output node of data input circuit 105. Data input circuit 105 outputs input data DIN, which is set at the VS voltage or a high level voltage according to the logical state, "1" or "0", of the programmed data. In a read mode, sense amplifier 105 coupled with node 103 senses the data which depends on the potential at node 103.

For programming or writing data "0" into a memory cell M11, for example, the input data signal DIN output from data input circuit 105 is set at a high level voltage, and the decoded output from column decoder 102 sets column select line COL1 at a high level voltage. The high level voltage DIN renders transistor 104 Conductive. The high level voltage on column select line COL1 renders column select transistor C1 conductive. As a result, program voltage VP is applied to column line BL1. At this time, the decoded output signal from row decoder 101 provides a high level voltage on row line WL1, so that a high level voltage is applied to both the control gate and the drain of memory cell M11. Under this condition, impact ionization occurs in the channel region in the vicinity of the drain, to generate hot electrons. The generated hot electrons are in turn injected into the floating gate of cell transistor M11. In this way, the data write operation is performed.

For programming data "1" into memory cell M11, the input data signal DIN from data input circuit 105 is set at 0 V, or the VS potential, so that transistor 104 is rendered nonconductive. Under this condition, program voltage VP is not applied to column line BL1. Further, the floating gate of selected memory cell M11 keeps the neutral state. This state of the cell indicates the storage of data "1".

Recent semiconductor memory device formed of the nonvolatile memory cells progressively increases its memory capacity. With this, the time for programming the data into the memory cells is longer. The programming time must be reduced. To this end, in programming data, the cell transistor is generally operated in the avalanche region providing a high programming efficiency.

FIG. 2A typically shows one of the single memory cells of the EPROM of FIG. 1 and a data write circuit for writing data into the memory cell. In the circuit, the memory cell is denoted as M11. MOS transistors 104 and C1 make up the data write circuit. FIG. 2B shows data write characteristics of memory cells M11 with different channel lengths, and a load characteristic of the load circuit or the data write circuit. As shown, the data write characteristic is represented by a relationship of drain current ID versus drain voltage VD. FIG. 2B will be used mainly for explaining how the optimum operating point of the cell transistor depends on the channel length of the transistor in a data write mode. For plotting the data write characteristic curves I to V, a high level voltage was applied to the gates of MOS transistors 104 and C1, and a program high voltage was applied to the control gate of memory cell M11. Curve I indicates an ID−VD characteristic of memory cell M11. Rectilinear curve IV indicates a load characteristic of the write circuit formed of MOS transistors 104 and C1. The memory circuit is operated at the intersection A of curves I and IV. In other words, the circuit is operated with the drain voltage and the drain currents as indicated by point A. V denotes a line extending through point (VP−VTH) on the axis of abscissas and point A. VTH denotes the threshold voltage of MOS transistor 104.

In manufacturing memory devices including the MOS transistors, neverthersless, a variance in the channel lengths of the manufactured transistors is inevitable although it is within a limited range. The above optimum operating point of the memory circuit in a data program or write mode, depends greatly on the channel length of the transistor. This will be described referring to FIG. 2B. Curve II shows a data write characteristic of the memory circuit in which the cell transistor has a channel length longer than a specified value. When it is shorter, the data write characteristic varies as indicated by curve III. For writing data, the memory circuit having the cell transistor with the long channel length is operated at the intersection B of curves II and IV. Similarly, the memory circuit having the cell transistor with the short channel length is operated at the intersection C of curves III and IV. Point B resides outside the avalanche region. Therefore, an insufficient number of electrons are injected into the floating gate, leading to incorrect data programming. Point C resides in the avalanche region. At this point, however, drain current ID is very large. This indicates that the circuit operation at this point C consumes a large power.

In the MOS transistor 104, which is operated in a saturation region, drain current ID is mathematically expressed $$ID = \frac{\beta}{2}(VG - VTH)^2 \quad (1)$$

where $\beta$ is the current amplification factor of transistor 104, VG the gate voltage, and VTH the threshold voltage. The equation (1) implies that drain current ID varies proportional to the square of (VG−VTH) which represents as a difference between gate voltage VG and threshold voltage VTH. Thus, the load characteristic curve is steep, and points B and C are greatly shifted from the optimum operating point A. The problems of the circuit when it is operated at point B or C are as already mentioned. If the load characteristic curve has a more gentle inclination as indicated by rectilinear curve V, the operating points B and C are within the avalanche region and the drain currents required are more near that for the optimum operating point A. Another cause for the steepness of the load characteristic curve is that drain current ID starts to rise at the drain voltage which is lower than program voltage VP by threshold voltage VTH.

The description of the problems of the prior art will be further continued referring to FIG. 3 showing a pattern of cell transistors of the memory device. As shown, a number of cell transistors are linearly arrayed in both row and column directions, to form a matrix array. The control gate of memory cell M11 is continuous to row line WL1 made of polysilicon extending in the row direction. The source is connected through conductive interconnection wire N1 formed of impurity diffusion layer to ground potential line N2 made of aluminum Ae. The drain of the transistor is connected to column line N3 made of aluminum extending in the column direction. To reduce the area for the memory cell array on a semiconductor chip, ground lines N2 are provided one for eight memory cells, or 8 bits. The diffusion layer N1 existing between the source of each memory cell and the related ground line N2 has a resistance. The resistance depends on the location of each memory cell. In the illustrated case, as the distance of the memory cell from ground line N2 becomes longer, the resistance becomes larger. That is, the memory cell located at the mid-point of the space between adjacent two ground lines N2 has the largest resistance.

Turning now to FIG. 4, there is shown an electrical expression of the memory device or EPROM as physically patterned as shown in FIG. 3. As shown, the control gate of memory cell M11 is connected to row line WL1 for receiving the output signal of row decoder 101. The drain is connected to column line N3. The source is connected to ground line N2, via source resistor R representative of the resistance of interconnection wire N1 between the source and ground line N2. Column line N3 is connected to the source of MOS transistor C1. The gate of transistor C1 is connected to column select line COL1 for receiving the output signal of column decoder 102. The drain of transistor C1 is connected to the source of E type MOS transistor 104 as its load transistor. The drain of load transistor 104 is coupled with high voltage power source VP, which is for data programming. The gate of transistor 104 is connected to data input circuit DIC for providing the data of "1" or "0" to be programmed into a specified memory cell in response to an external signal. Transistors 104 and C1 make up a data write circuit for programming data into a specified memory cell. The data programming operation as described referring to FIG. 1 is correspondingly applied to the data programming operation of this circuit.

FIG. 5 shows three curves I to III. Curve I is a data write characteristic, i.e., ID−VD curve, of the memory cell M11 with a small source resistance, viz., the memory cell located closest to ground line N2, when data "0" is written into that memory cell. Rectilinear curve II indicates a load characteristic of the load circuit formed of the data write circuit. Curve III indicates the ID−VD curve of a memory cell with a large source resistance, which is most distanced from ground line N2 or at the mid-point between two ground lines N2. Cross-point A of curves I and II is an optimum operating point of this memory device when "0" is written into the memory cell. As the drain current ID as specified by the operating point A is larger, the number of hot electrons generated in the channel region near the drain of the cell transistor becomes larger. The number of electrons injected into the cell per unit time is also larger. Therefore, if the operating point of the memory circuit is placed in its avalanche region, the data writing time may be reduced.

When the ID−VD curve III of the memory cell with a large source resistance is compared with the ID−VD curve I of the memory cell, the breakdown voltage of the memory cell with a large source resistance is higher than that of the memory cell of a low source resistance, by the voltage drop corresponding to a difference between the source resistances. Therefore, when a single load circuit is used for those memory cells with different source resistances, the cross-points of the ID−VD curves and the load characteristic curve are different from one another. For example, point A is different from point B of curves II and III. The drain current for point B is smaller than that for point A. This implies that the injection charge per unit time is small, possibly leading to errors in data programming. For correct data programming, a long programming time is needed.

If the operating point of the memory circuit is set at the cross-point of the ID−VD curve of the memory cell with a low source resistance and the load curve, the data programming into the low-source-resistance memory cell can be performed correctly and for a short time. However, the high-source-resistance memory cell may suffer from errors in data programming, and a long time is needed for correct data programming. On the other hand, if the operating point is set at the intersection of the ID—VD curve of the high-source-resistance memory cell and the load curve, the drain current ID of the low-source-resistance memory cell is too large, resulting in excessive power dissipation.

As described above, the conventional memory devices involve the problems of long data write time and excessive power dissipation.

SUMMARY OF THE INVENTION

Accordingly, an object of this invention is to provide a nonvolatile semiconductor memory device whose data write characteristic is stable against a variance of the channel lengths of cell transistors, with a lessened inclination of the load characteristic curve.

Another object of this invention is to provide a nonvolatile semiconductor memory device in which a wasteful power dissipation of cell transistors due to the difference of the source resistances of the cell transistors may be reduced, and hence a variance in the numbers of electrons injected into the memory cells may be reduced.

According to one aspect of this invention, there is provided a nonvolatile semiconductor memory device comprising:

a power source;
a nonvolatile memory cell;
a load transistor connected between said power source and said nonvolatile memory cell, the gate of said load transistor being coupled for reception with an input data signal; and
a wiring layer connected in series to said load transistor and between said power source and said memory cell, resistance of said wiring layer being larger than the on-resistance of said load transistor.

The load resistor substantially determines the load characteristic. Therefore, the load characteristic curve is more gentle in inclination and more rectilinear in shape. This makes the data writing operation stable against a variance in the channel lengths of the manufactured cell transistors.

According to another aspect of this invention, there is provided a nonvolatile semiconductor memory device comprising:

a power source;
a nonvolatile memory cell;
a load transistor connected between said power source and said nonvolatile memory cell, the gate of said load transistor being coupled for reception with an input data signal;
a column select transistor connected between said load transistor and said memory cell; and
a wiring layer connected in series to said load transistor and between said power source and said memory cell, resistance of said wiring layer being larger than the on-resistance of said load transistor, said wiring layer being laid on a field region between adjacent those of said column select transistor.

Location of the wiring layer on the field region between the adjacent two column select transistors, requires no additional chip area for the wiring layer.

According to a further aspect of this invention there is provided a nonvolatile semiconductor memory device comprising:

a plurality of memory cell circuits each including a nonvolatile memory cell connected to a reference voltage via a conductive layer having a resistance, and a plurality of semiconductor elements connected in series between a power source voltage and said memory cell; and a resistance value of at least one of said plurality of semiconductor elements different among said memory cell circuits and being selected according to the resistance of said conductive layer.

An inclination of the load characteristic curve is set according to the source resistance of each memory. Therefore, the memory circuits may be set at substantially the same operating points. This will secure stable data write to all the memory cells even if the source resistances of the memory cells are different.

BRIEF DESCRIPTION OF THE DRAWINGS

FIG. 2A shows a circuit diagram of a circuit including a memory cell circuit of one bit and a data write circuit;

FIG. 2B shows a graphical representation of the ID—VD curves of cell transistors with different channel lengths, and a load characteristic of a load transistor contained in the data write circuit;

FIGS. 11 through 14 show circuit diagrams of PROMs according to further embodiments of this invention;

DETAILED DESCRIPTION OF THE PREFERRED EMBODIMENTS

Figure 6A:
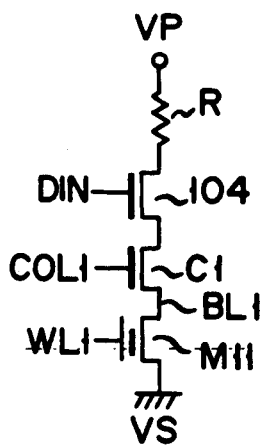
FIGS. 6A to 6C show circuit diagrams of three types of circuits each including a one-bit memory cell circuit and a data write circuit, which are arranged according to an embodiment of this invention.
Figure 6B:
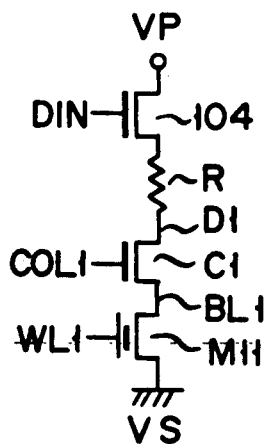
Figure 6C:
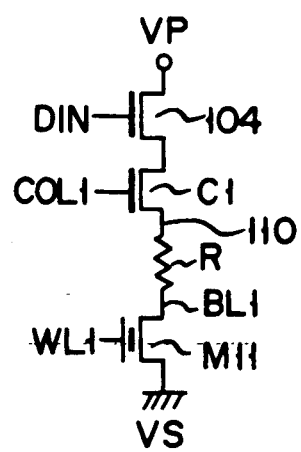

Reference is first made to FIGS. 6A to 6C illustrating three types of circuit arrangements each including a one-bit memory cell circuit and a data write circuit, which are constructed according to an embodiment of this invention. In those circuits, like reference symbols are used for designating like portions in the figures used for the prior art description. As shown, load transistor 104, column select transistor C1, and cell transistor M11, and further resistor R are connected in series between high potential power source VP for data programming and a ground potential. Cell transistor M11 is a double-gate nonvolatile transistor having a control gate and a floating gate. The gate of load transistor 104 is coupled for reception with a programmed data input signal DIN. The gate of column select transistor C1 is coupled with a column select signal COL1 output from a column decoder (not shown). The control gate of cell transistor M11 is coupled with row select signal WL1 from a row select decoder (not shown). In the FIG. 6A circuit, resistor R is inserted between program power source VP and load transistor 104. In the FIG. 6B circuit, resistor R is inserted between load transistor 104 and column select transistor C1. In the FIG. 6C circuit, resistor R is connected between column select transistor C1 and cell transistor M11.

Figure 7A:
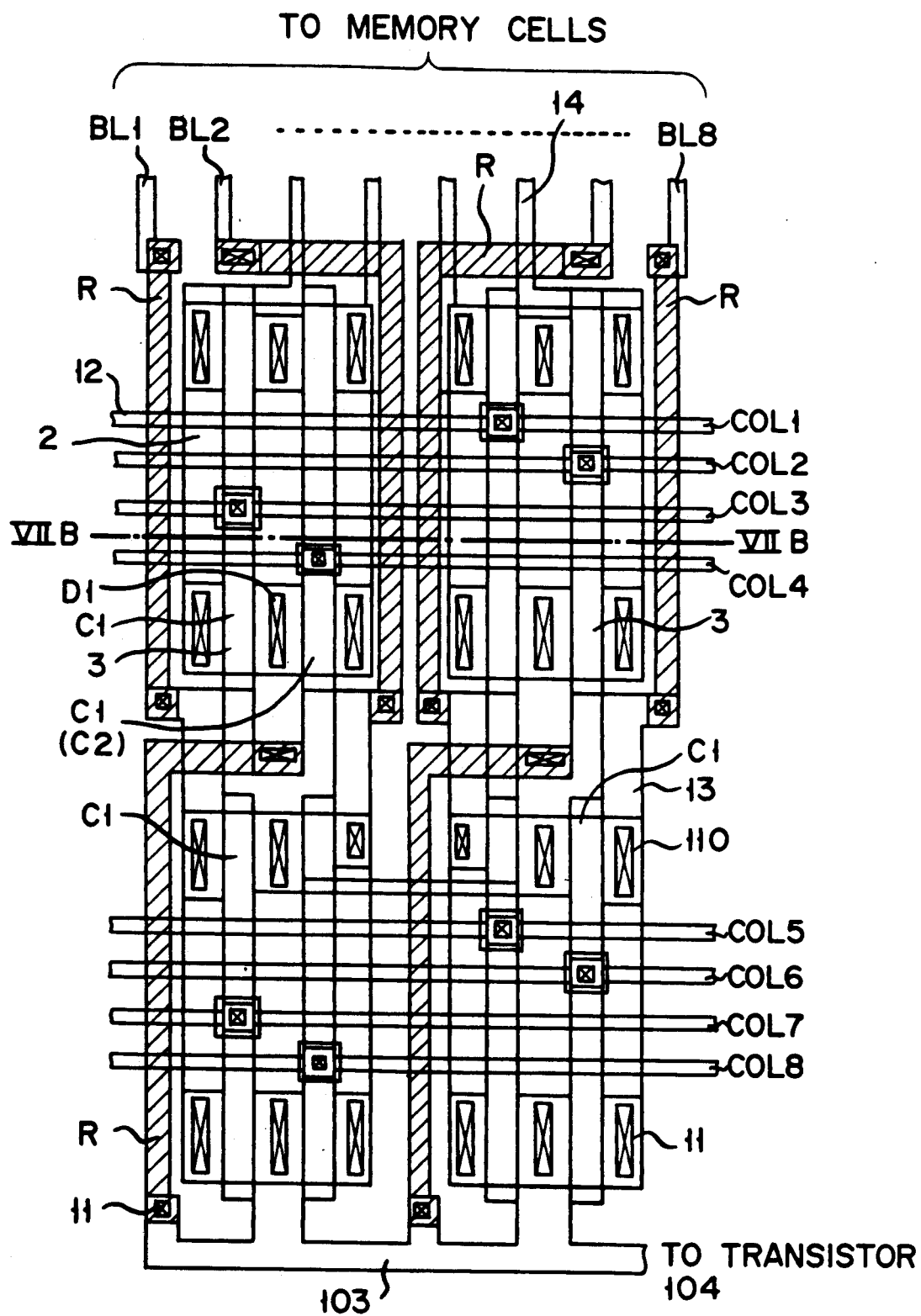
FIG. 7A shows a plan view showing a PROM, which is patterned according to the schemes of FIGS. 6B and 6C.
Figure 7B:
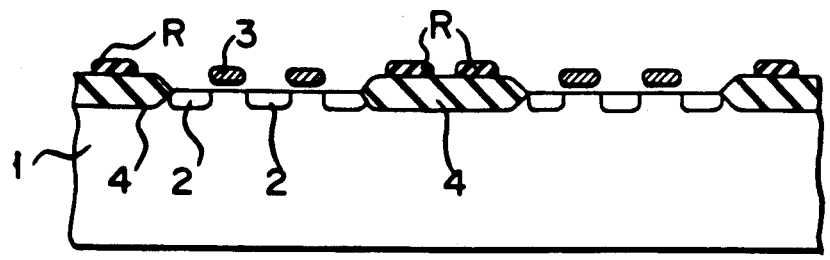
FIG. 7B shows a sectional view taken on line VIIB—VIIB in FIG. 7A.

FIG. 7A illustrates a pattern of a part of PROM, which is arranged according to the schemes of FIGS. 6B and 6C. A sectional view taken on line IIIB—IIIB in FIG. 7A is illustrated in FIG. 7B. In these figures, reference numeral 1 designates a semiconductor substrate, 2 a source or drain of a column select transistor, 3 a gate electrode lead wire, 4 a field insulating film. In this instance, resistor layer R is formed of a polysilicon layer, but it may be substituted by an impurity diffusion layer. Interconnection wires 12 to 14, and 103 are made of aluminum, and in contact with resistor layers R through contact holes 11. Gate electrode 3 is made of polysilicon.

It is preferable that resistance of resistor R is equal to or larger than the on-resistance of load transistor 104. If the resistance of resistor R is so selected that the resistor R predominantly determines the load characteristic curve, then the load characteristic curve is more rectilinear and more gentle in inclination and close to curve V of FIG. 2B.

The layers of resistors R are formed on the field oxide films between the adjacent column select transistors C1 to Cn, as shown in FIGS. 7A and 7B. Therefore, formation of the resistor layers does not require any additional area for the semiconductor chip.

Figure 8A:
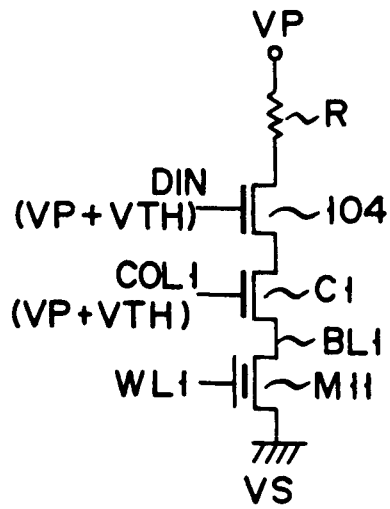
FIGS. 8A to 8C show circuit diagrams of three types of circuits each including a one-bit memory cell circuit and a data write circuit, which are arranged according to another embodiment of this invention.
Figure 8B:
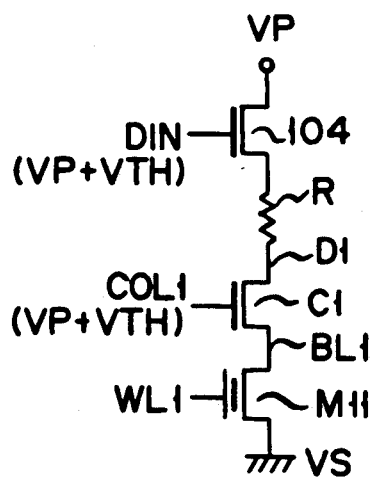
Figure 8C:
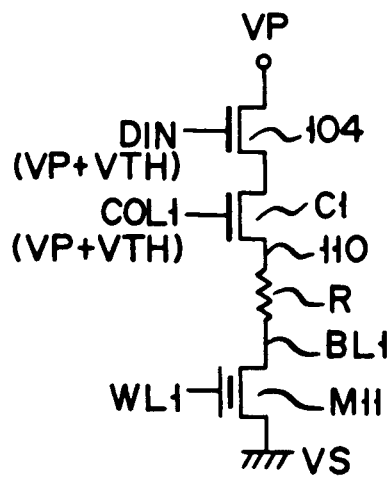
Figure 8D:
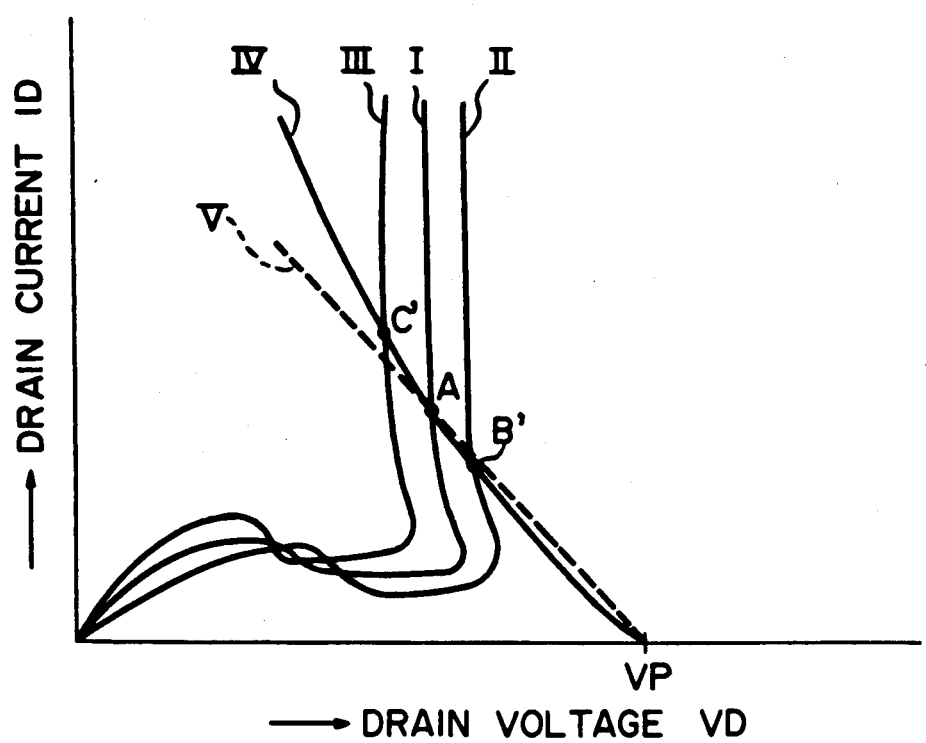
FIG. 8D shows a graphical representation of the ID—VD curves of the cell transistors and a load characteristic curve of the load transistor, those transistors being contained in the FIGS. 8A to 8C.

FIGS. 8A to 8C show circuit diagrams of circuits including a one-bit memory cell and a data write circuit, which are modifications of the FIGS. 6A to 6C circuits. In these circuits, the potential of data input signal DIN and column select signal COL1 are increased to (VP+VTH) or more. In this embodiment, presence of resistor R provides a load characteristic curve which is more rectilinear in shape and more gentle in inclination. Further, the drain current starts to flow at program voltage VP. This makes the load characteristic curve more gentle, as shown by curve V in FIG. 8D. Thus, this embodiment provides a further improvement of the data write characteristic. Curves I, II and III in FIG. 8D corresponds to curves I, II and III in FIG. 2B, respectively. Curve IV denotes a load characteristic in a case where signals DIN and COL1 are increased to (VP+VTH) or more and no resistor R is provided. A indicates a cross-point of curves I and IV. B' indicates a cross-point of curves II and IV, and C' denotes a cross-point of curves III and IV.

Figure 9:
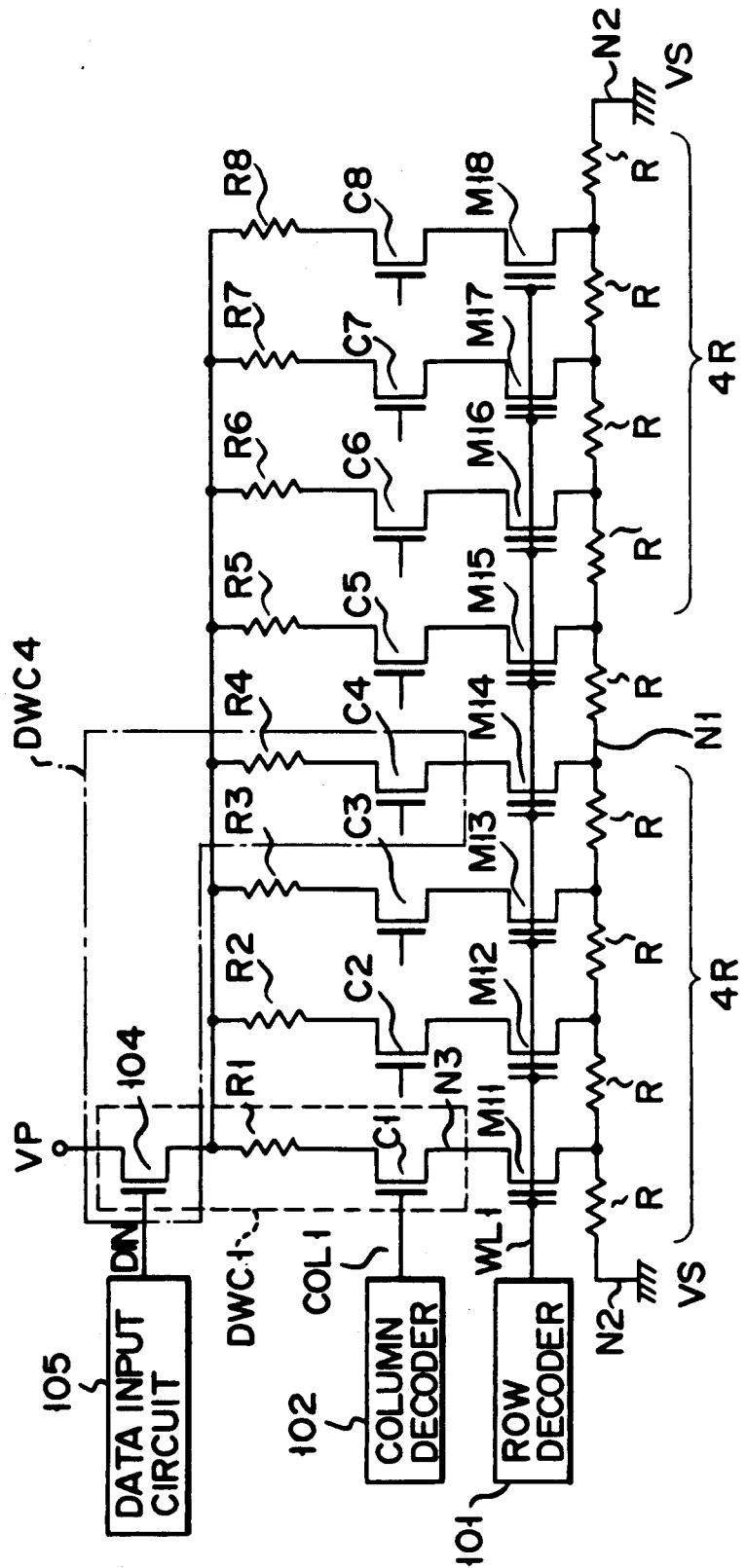
FIG. 9 shows a circuit diagram of a PROM according to yet another embodiment of this invention.

FIG. 9 shows a circuit arrangement of a PROM according to a further embodiment of the present invention.

Figure 1:
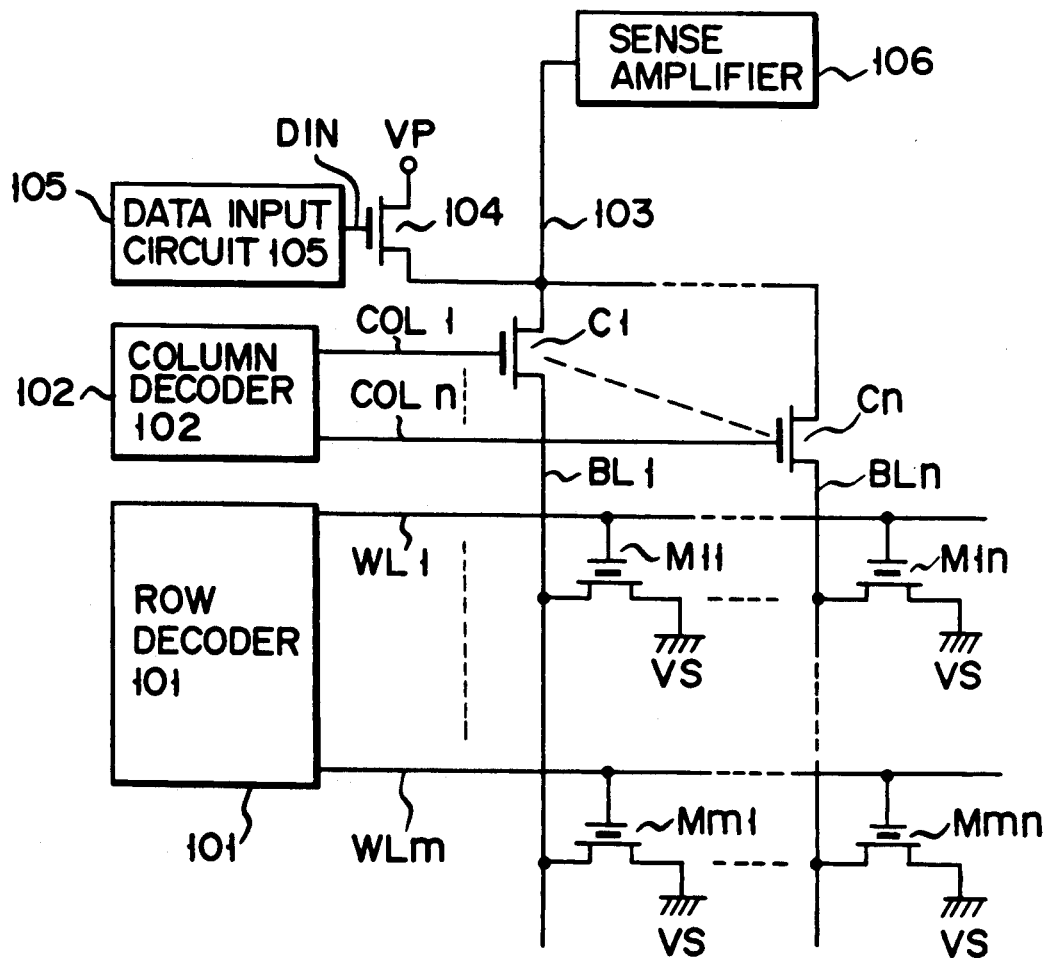
FIG. 1 shows a circuit diagram of a conventional PROM.
Figure 3:
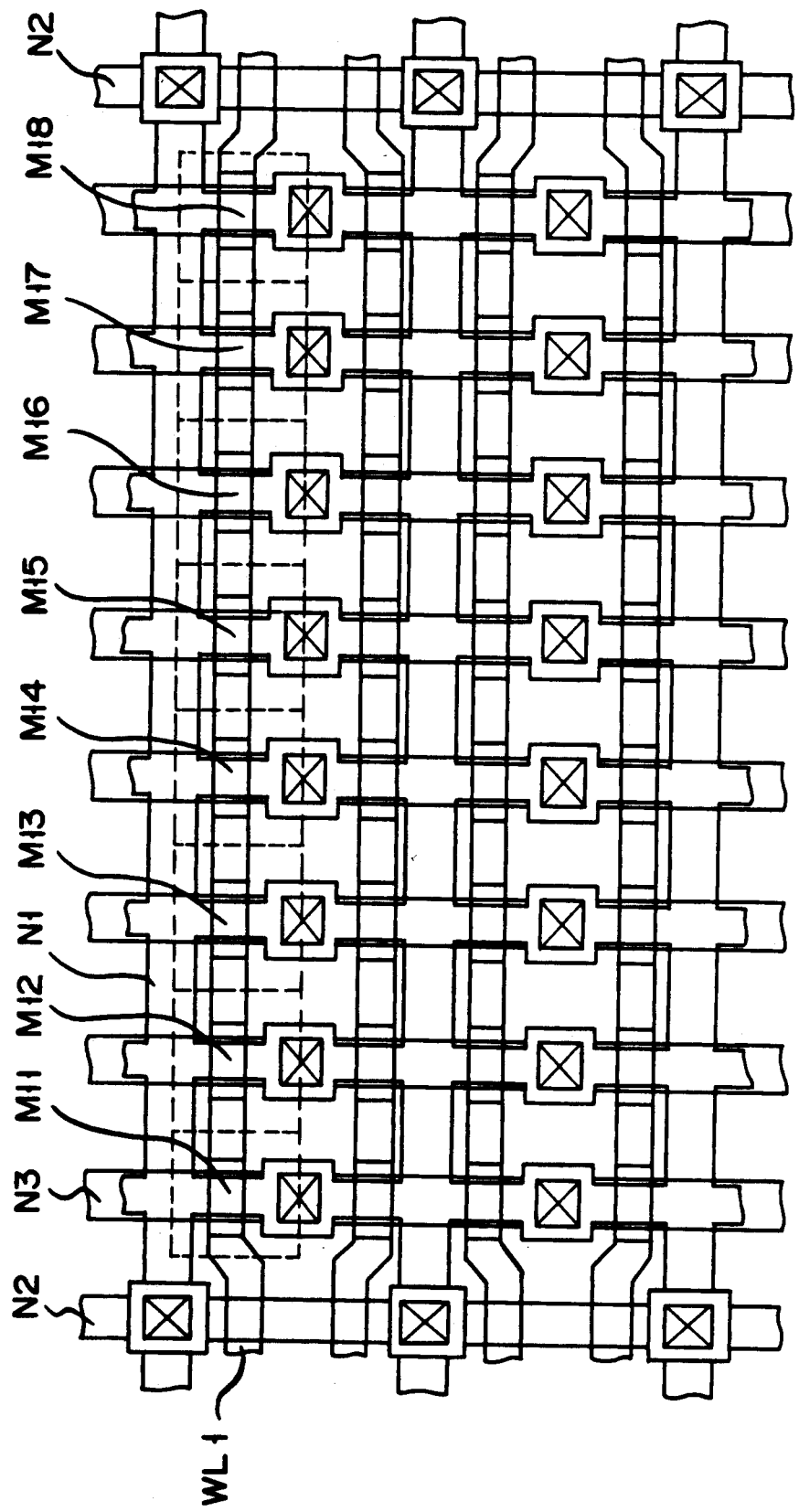
FIG. 3 shows a plan view of a pattern of memory cells.

As shown, the control gate of memory cell M11 is connected to row line WL1 coupled for reception with the output signal of row decoder 101. The drain is connected to column line N3. The source is connected to ground line N2, via source resistor R representative of the resistance of the interconnection wire N1 between the source and the ground line. Column line N3 is connected to the source of MOS transistor C1. The gate of transistor C1 is connected to column select line COL1 coupled for reception with the output signal of column decoder 102. The drain of load transistor 104 is coupled with high voltage power source VP, which is for data programming. The gate of transistor 104 is connected to data input circuit 105 for providing the data of "1" or "0" to be programmed into a specified memory Cell in response to an external signal. Transistors 104 and C1, and resistor R1 make up a data write circuit for programming data into memory cell M11. The data programming operation as described referring to FIG. 1 is correspondingly applied to the data programming operation of this circuit.

In this circuit, resistors R1 to R8, which are constructed with diffusion layers or polysilicon layers, are connected between the source of load transistor 104 and the drains of column select transistors C1 to C8, respectively. Resistance values of these resistors R1 to R8 are selected so as to be inversely proportional to the source resistance values of the memory cells associated with the resistors. In this instance, $R1 > R2 > R3 > R4$, $R8 > R7 > R6 > R5$, and $R1 = R8$, $R2 = R7$, $R3 = R6$, and $R4 = R5$. These relations result from the fact that memory cells M11 to Ml8 are located between two ground lines N2 and that as discussed above, the source resistance of the memory cell increases proportional to the distance of the memory cell location from the ground line.

Figure 10:
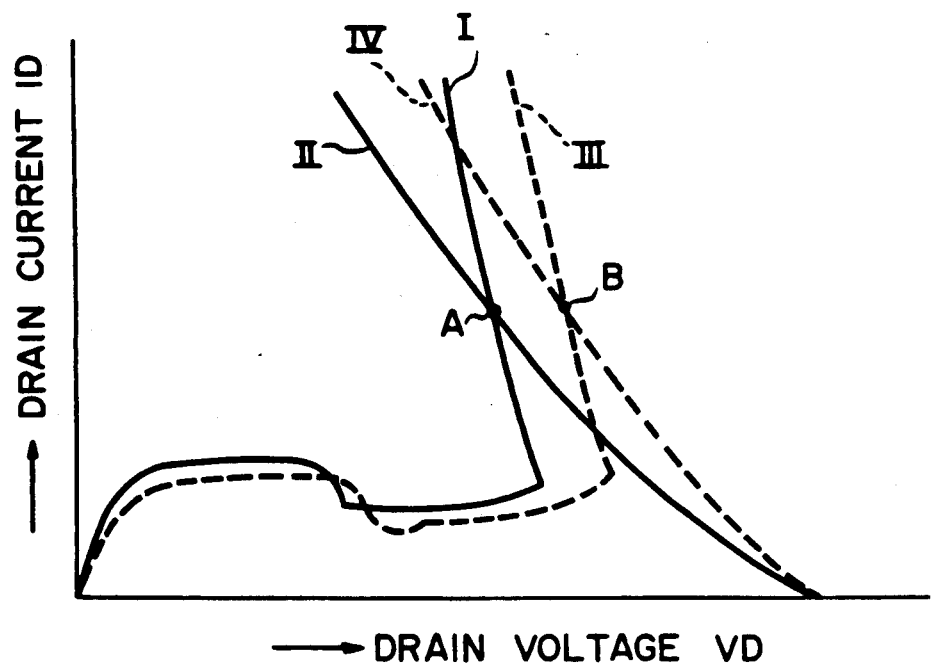
FIG. 10 shows a graph showing the ID—VD curves of cell transistors and a load characteristic curve of a load transistor, the illustration being useful in explaining the operation of the FIG. 9 circuit.

In the PROM having resistors R1 to R8 thus arranged and having resistance values thus selected, the resistor R1, which is coupled with the memory cell M11 having the smallest source resistance, most greatly contributes to the load characteristic of the load circuit including load transistor 104 and provides the most gentle load characteristic curve (curve II in FIG. 10). The resistor R4, which is coupled with memory cell M14 having the largest source resistance, most lightly contributes to the load characteristic of the load circuit, and provides the most steep load characteristic curve (curve IV). Therefore, the operating points of all the cell transistors may be set at substantially the same level of drain current (points A and B in FIG. 10). The result is that the number of electrons injected to the floating gates of the cell transistors are substantially equal. Incidentally, in FIG. 10 curve I indicates the ID−VD curve of cell transistor M11, which is closest to ground line N2. Curve III indicates the ID−VD curve of cell transistor Ml4, which is most distanced from ground line N2. Curve II is a load characteristic curve of the data write circuit for the memory cell M11. The data write circuit includes resistor R1 having the largest resistance. Curve IV is a load characteristic curve of the data write circuit for the memory cell M14. The data write circuit includes resistor R4.

Figure 11:
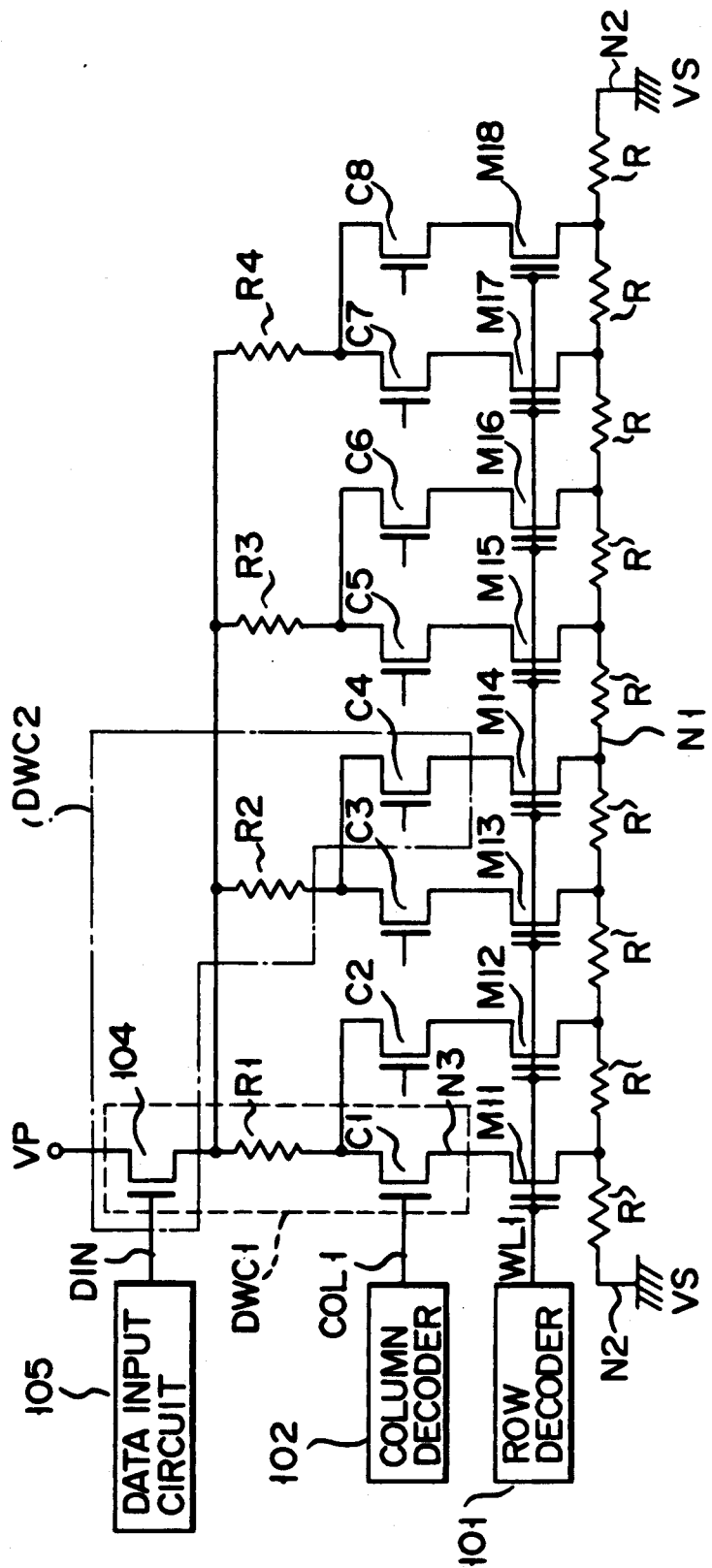

The circuit arrangement of FIG. 9 may be modified into a circuit arrangement as shown in FIG. 11. In the modified PROM, one load resistor is coupled in common with two adjacent column select transistors. As shown, resistor R1, for example, is connected at one end to load transistor 104, and at the other end to two adjacent column select transistors C1 and C2. This modification saves the chip area required for the memory device.

The circuit arrangement of FIG. 9 may be further modified into a circuit arrangement as shown in FIG. 12. In this modification, load resistors R1 to R8 are connected between column select transistors C1 to C8 and memory cells M11 to M18, respectively.

Figure 4:
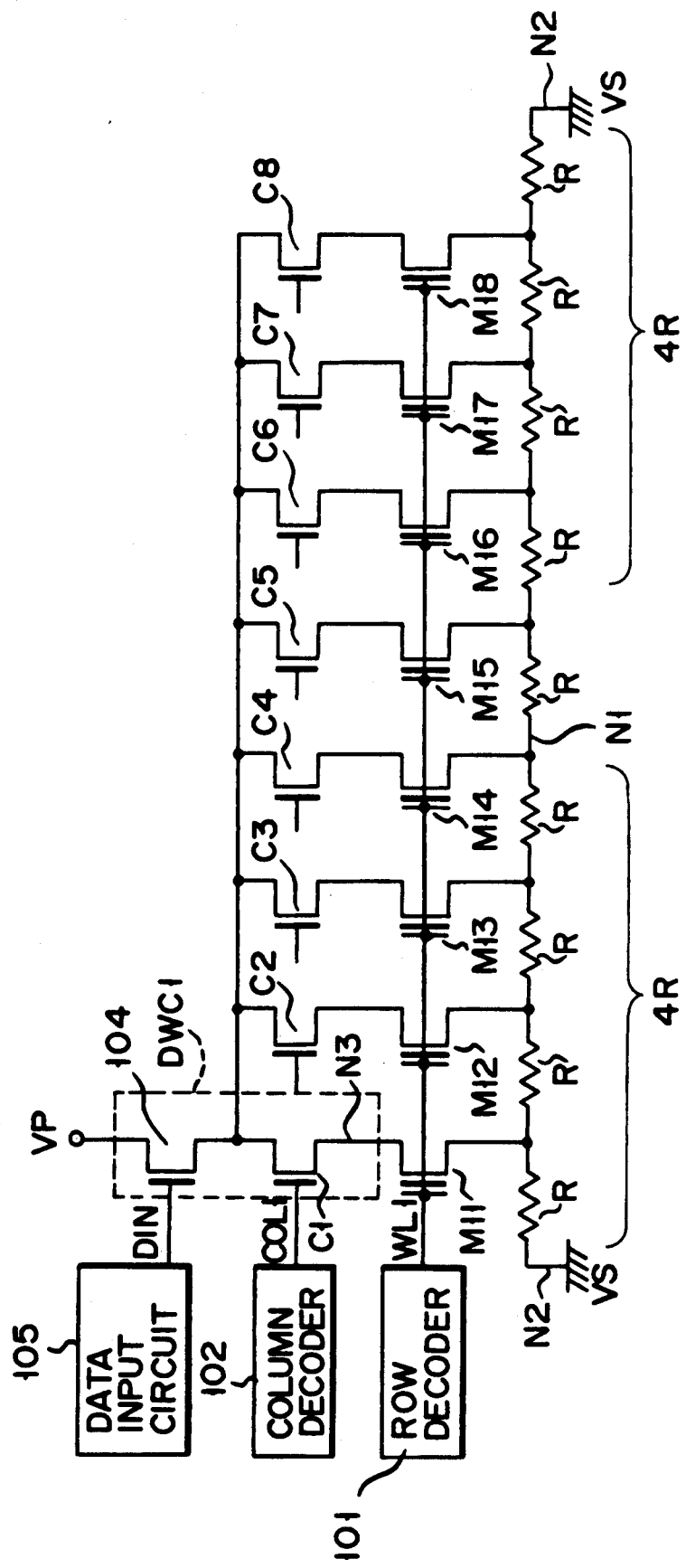
FIG. 4 shows a circuit diagram of the PROM shown in FIG. 3.
Figure 5:
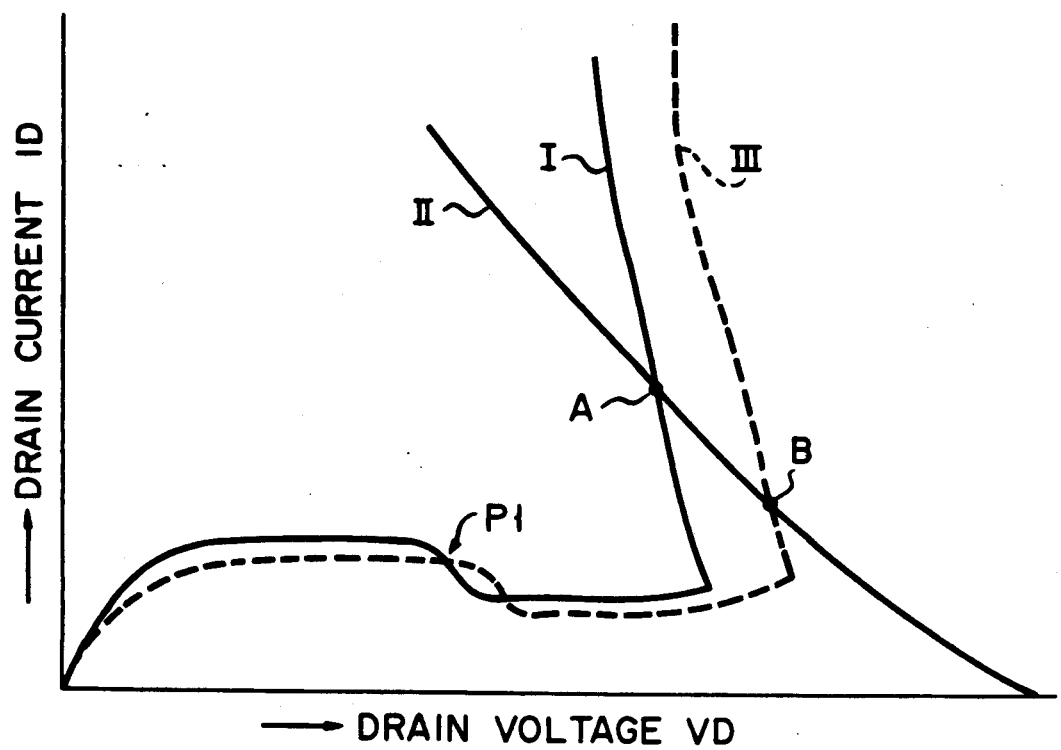
FIG. 5 shows a graphical representation of the ID—VD curves of some specific memory cells in the circuit of FIG. 4, and a load characteristic of a load transistor contained in the data write circuit, which is also contained in ,the FIG. 4 circuit.
Figure 13:
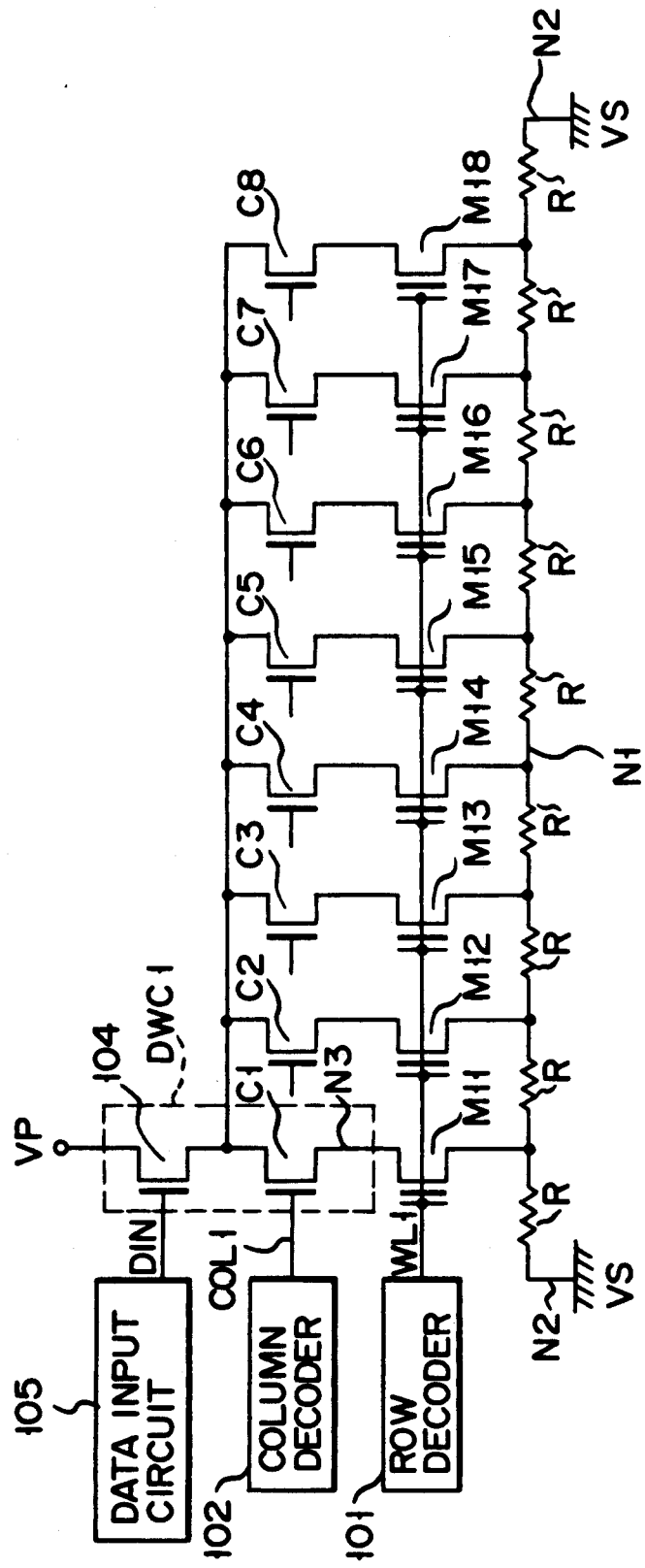

FIG. 13 shows a still further embodiment of a nonvolatile semiconductor memory device according to this invention. The circuit arrangement of FIG. 13 is substantially the same as that of FIG. 4, except that the geometrical sizes of column select transistors C1 to C8 are selected such that the resistances thereof are increased by the resistances of the resistors R1 to R8 additionally used in the FIG. 9 circuit.

Figure 14:
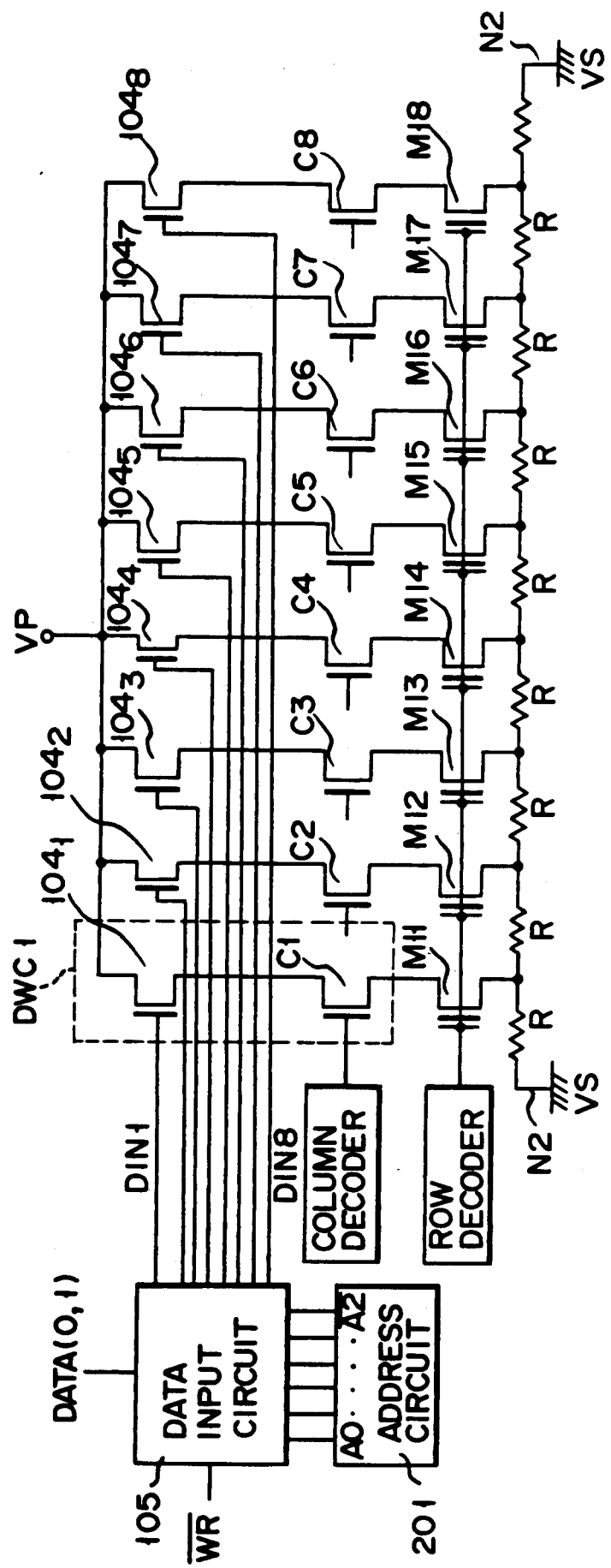

FIG. 14 shows a further embodiment of this invention. In this circuit arrangement, load transistors $104_1$ to $104_8$ are used and respectively connected to column select transistors C1 to C8. The geometrical sizes of load transistors $104_1$ to $104_8$ are selected so as to have resistances of resistors R1 to R8 used in FIG. 9. In response to data "1" or "0" externally applied and address signals A0, $\overline{A0}$, A1, $\overline{A1}$, A2, $\overline{A2}$ from address circuit 201, data input circuit 105 applies data input signals DIN1, DIN2, ..., DIN8 to the gates of load transistors $104_1$, $104_2$, ..., $104_8$, respectively. The address signal, which is applied to data input circuit and specifies a load transistor to be selected, corresponds to the address signal used for specify a memory cell to be selected. For example, if the address signal is for specifying memory cell M11, load transistor $104_1$ is selected by input data signal DIN1, while the remaining load transistors remain off. Similarly, if the address signal is for specifying memory cell M18, load transistor $104_8$ is selected, while the remaining load transistors are left unselected.

Figures 15, 16:
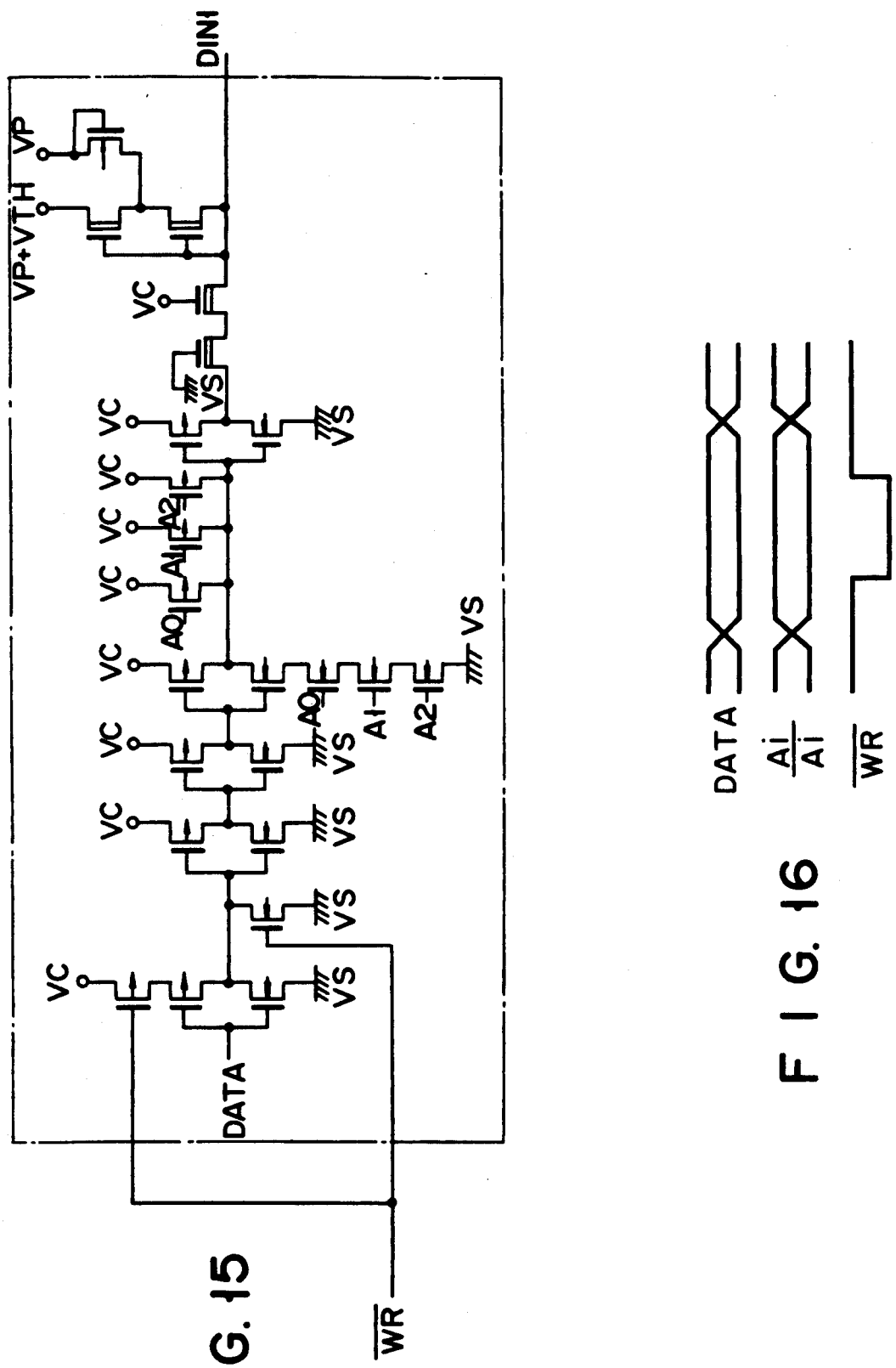
FIG. 15 shows a circuit diagram showing the details of one bit of a data input circuit used in the FIG. 14 PROM.
FIG. 16 shows signal charts applied to the circuit of FIG. 15.

FIG. 15 shows a circuit diagram showing the details of the data input circuit DI used in FIG. 14 circuit. The illustration is limited to the circuit arrangement of one bit, for simplicity. Since the FIG. 14 circuit has eight memory cells, the actual data input circuit 105 includes eight FIG. 15 circuits.

FIG. 16 shows a chart of DATA, Ai, $\overline{Ai}$, and WR. $\overline{WR}$ denotes a write signal. When write signal $\overline{WR}$ is at low level, DATA is stored in a memory cell.

Figure 17:
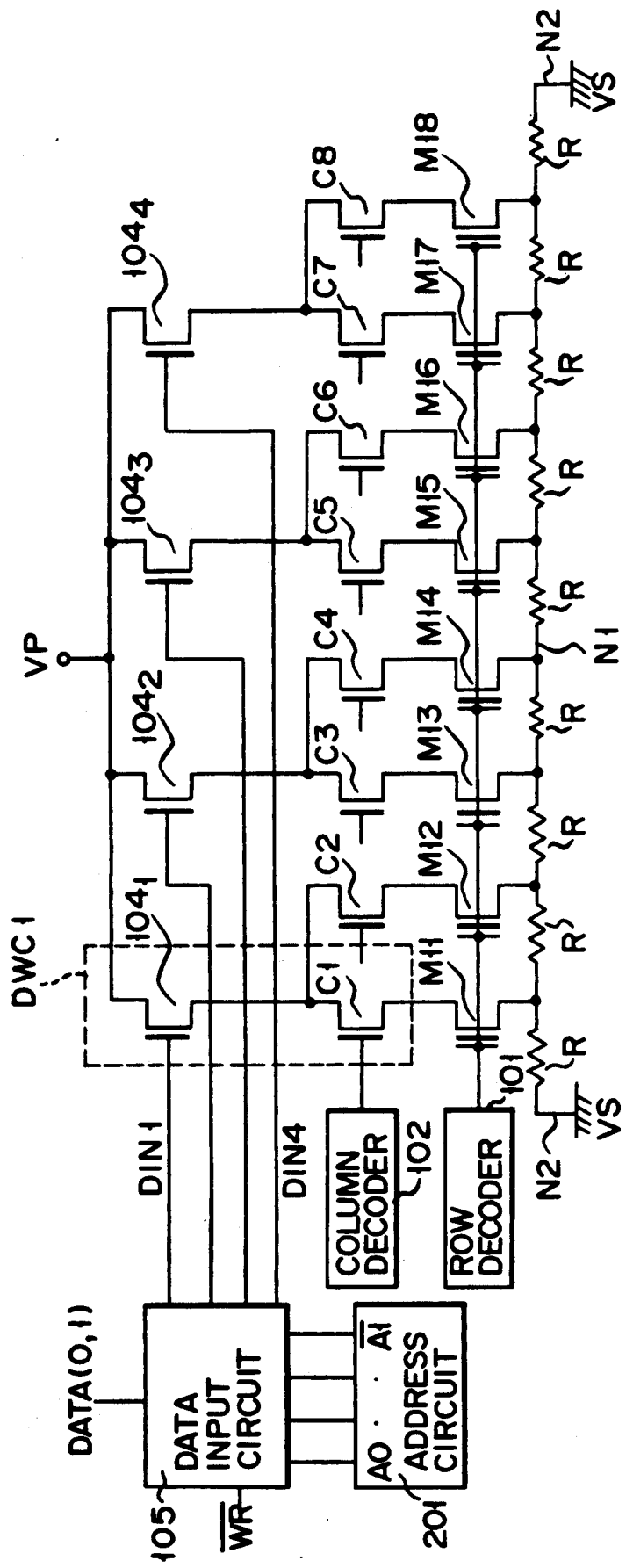
FIG. 17 shows a circuit diagram of a PROM according to a still further embodiment of this invention.

As shown in FIG. 17, one load transistor may be provided for two adjacent column select transistors. For example, load transistor $104_1$ is connected to two adjacent column select transistors C1 and C2. In this case, address circuit 201 produces 4-bit address signals A0, $\overline{A0}$, A1 and $\overline{A1}$.

As seen from the foregoing, load resistors are additionally used. The resistance of the load resistor is so selected as to substantially determine the load characteristic of the load circuit, so that the load characteristic curve is more gentle in inclination and more rectilinear in shape. Therefore, the data writing is stable against a variance in the channel lengths of the manufactured cell transistors. Further, use of additional load resistors brings about no increase of chip area used.

Further, the resistance values of load resistors are selected to be inversely proportional to the source resistance of cell transistors. This makes the drain currents of the cell transistors uniform. Therefore, the power dissipation and the electrons injected into cell transistors are substantially fixed and equal.

What is claimed is:

1. A nonvolatile semiconductor memory device comprising:
   a power source;
   a nonvolatile memory cell transistor having a drain and a source;
   a load transistor having a drain, a source, and a gate, said source of said load transistor being coupled to said drain of said memory cell transistor, said drain of said load transistor being connected to said power source, and said gate of said load transistor being coupled for reception of an input data signal; and
   a wiring layer connected in series to a path of said drain and said source of said load transistor and between said power source and said drain of said memory cell transistor, resistance of said wiring layer being larger than a resistance of said load transistor when said load transistor is turned on.

2. The memory device according to claim 1, in which said wiring layer is a polysilicon layer.

3. The memory device according to claim 1, in which said wiring layer is an impurity diffusion layer.

4. The memory device according to claim 1, further comprising a column select transistor connected between said load transistor and said memory cell.

5. The memory device according to claim 1, in which said wiring layer is inserted between said power source and said load transistor.

6. The memory device according to claim 4, in which said wiring layer is inserted between said column select transistor and said load transistor.

7. The memory device according to claim 4, in which said wiring layer is inserted between said column select transistor and said memory cell.

8. A nonvolatile semiconductor memory device comprising:
   a power source;
   a nonvolatile memory cell transistor having a drain and a source;
   a load transistor having a drain, a source, and a gate, said source of said load transistor being coupled to said drain of said memory cell transistor, said drain of said load transistor being connected to said power source, and said gate of said load transistor being coupled for reception of an input data signal;
   a column select transistor having a drain and a source whose path is connected between a path of said drain and said source of said load transistor and a path of said drain and said source of said memory cell transistor; and
   a wiring layer connected in series to a path of said drain and said source of said load transistor and between said power source and said drain of said memory cell transistor, resistance of said wiring layer being larger than a resistance of said load transistor when said load transistor is turned on, said wiring layer being laid on a field region adjacent that of said column select transistor.

9. The memory device according to claim 8, in which said wiring layer is a pollysilicon layer.

10. The memory device according to claim 8, in which said wiring layer is an impurity diffusion layer.

11. The memory device according to claim 8, in which said wiring layer is inserted between said power source and said load transistor.

12. The memory device according to claim 8, in which said wiring layer is inserted between said column select transistor and said load transistor.

13. The memory device according to claim 8, in which said wiring layer is inserted between said column select transistor and said memory cell.

14. A nonvolatile semiconductor memory device comprising:
a plurality of memory cell circuits each including
a nonvolatile memory cell transistor having a drain and a source whose path is connected to a reference voltage via a conductive layer having a resistance; and
a plurality of semiconductor elements connected in series between a power source voltage and the path of the drain and the source of the memory cell transistor, including
a load transistor coupled with the power source voltage and coupled at the gate with an input data signal,
a column select transistor coupled with the memory cell transistor and coupled at the gate with a column select signal,
and a resistor, connected between the load transistor and the column select transistor,
wherein the resistor in at least one of the memory cell circuits has a resistance that is different from that of the resistor in another memory cell circuit, and which is selected according to the resistance of the conductive layer.

15. The memory device according to claim 14, in which said resistor is a polysilicon layer.

16. The memory device according to claim 14, in which said resistor is an impurity diffusion layer.

17. A nonvolatile semiconductor memory device comprising:
a plurality of memory cell circuits each including
a nonvolatile memory cell transistor having drain and a source whose path is connected to a reference voltage via conductive layer having a resistance; and
a plurality of semiconductor elements connected in series between a power source voltage and the path of the drain and the source of the memory cell transistor, including
a load transistor coupled with the power source voltage and coupled at the gate with an input data signal,
a column select transistor coupled with the load transistor and coupled at the gate with a column select signal, and
a resistor connected between the column select transistor and the memory cell transistor,
wherein the resistor in at least one of the memory cell circuits has a resistance that is different from that of the resistor in another memory cell circuit, and which is selected according to the resistance of the conductive layer.

18. A nonvolatile semiconductor memory device comprising:
a plurality of memory cell circuits each including
a nonvolatile memory cell transistor having drain and a source whose path is connected to a reference voltage via conductive layer having a resistance; and
a plurality of semiconductor elements connected in series between a power source voltage and the path of the drain and the source of the memory cell transistor, including
a load transistor coupled with the power source voltage and coupled at the gate with an input data signal, and
a column select transistor coupled with the memory cell transistor and coupled at the gate with a column select signal,
wherein the column select transistor in at least one of the memory cell circuits has a resistance that is different from that of the column select transistor in another memory cell circuit, and which is selected according to the resistance of the conductive layer.

19. A nonvolatile semiconductor memory device comprising:
a plurality of memory cell circuits each including
a nonvolatile memory cell transistor having drain and a source whose path is connected to a reference voltage via conductive layer having a resistance; and
a plurality of semiconductor elements connected in series between a power source voltage and the path of the drain and the source of the memory cell transistor, including
a load transistor coupled with the power source and coupled at the gate with an input data signal, and
a column select transistor coupled with the memory cell transistor and coupled at the gate with a column select signal,
wherein the load transistor in at least one of the memory cell circuits has a resistance that is different from that of the load transistor in another memory cell circuit, and which is selected according to the resistance of the conductive layer.

20. A nonvolatile semiconductor memory device comprising:
a plurality of memory cell circuits each including:
a nonvolatile memory cell transistor having drain and a source whose path is connected to a reference voltage via a conductive layer having a resistance; and
a plurality of semiconductor elements connected in series between a power source voltage and the path of the drain and the source of the memory cell transistor, including
a load transistor coupled with the power source voltage and coupled at the gate with an input data signal,
a column select transistor coupled with the memory cell transistor and coupled at the gate with a column select signal, and
a resistor, connected between the load transistor and the column select transistor, composed of an impurity diffusion layer,
wherein the resistor in at least one of the memory cell circuits has a resistance that is different from that of the resistor in another memory cell circuit, and which is selected according to the resistance of the conductive layer.

21. A nonvolatile semiconductor memory device comprising:

a plurality of memory cell circuit each including
  a nonvolatile memory cell transistor having drain and a source whose path is connected to a reference voltage via a conductive layer having a resistance; and
  a plurality of semiconductor elements connected in series between a power source voltage and the path of the drain and the source of the memory cell transistor, including
    a load transistor coupled with the power source voltage and coupled at the gate with an input data signal,
    a column select transistor coupled with the memory cell transistor and coupled at the gate with a column select signal, and
    a resistor, connected between the load transistor and the column select transistor, composed of a polysilicon layer,
wherein the resistor in at least one of the memory cell circuits has a resistance that is different from that of the resistor in another memory cell circuit, and which is selected according to the resistance of the conductive layer.

* * * * *